(12) United States Patent
Chen (10) Patent No.: US 8,525,241 B2
(45) Date of Patent: Sep. 3, 2013

(54) IMAGE SENSOR WITH RAISED PHOTOSENSITIVE ELEMENTS

(75) Inventor: Shenlin Chen, Rochester, NY (US)

(73) Assignee: Omni Vision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/473,307

(22) Filed: May 16, 2012

(65) Prior Publication Data
US 2012/0229684 A1 Sep. 13, 2012

Related U.S. Application Data

(62) Division of application No. 12/208,403, filed on Sep. 11, 2008, now Pat. No. 8,211,732.

(51) Int. Cl.
*H01L 27/146* (2006.01)

(52) U.S. Cl.
USPC .................. 257/292; 257/444; 257/E31.032

(58) Field of Classification Search
USPC .................. 257/292, 444, E31.032; 438/57, 438/59, 60
See application file for complete search history.

(56) References Cited

U.S. PATENT DOCUMENTS

| | | | |
|---|---|---|---|
| 5,481,124 A * | 1/1996 | Kozuka et al. ................. 257/444 |
| 6,153,446 A | 11/2000 | Chen et al. |
| 6,809,008 B1 | 10/2004 | Holm et al. |
| 6,869,817 B2 | 3/2005 | Hwang |
| 6,927,432 B2 | 8/2005 | Holm et al. |
| 6,943,051 B2 | 9/2005 | Augusto et al. |
| 6,984,816 B2 | 1/2006 | Holm et al. |
| 7,109,051 B2 | 9/2006 | Cave et al. |
| 7,153,720 B2 | 12/2006 | Augusto |
| 7,351,995 B2 * | 4/2008 | Hsu et al. ...................... 257/292 |
| 7,453,129 B2 | 11/2008 | King et al. |
| 7,521,737 B2 | 4/2009 | Augusto |
| 2001/0010952 A1 | 8/2001 | Abramovich |
| 2007/0024931 A1 | 2/2007 | Compton et al. |

FOREIGN PATENT DOCUMENTS

WO WO 2005/079199 9/2005

OTHER PUBLICATIONS

Joy, Tom et al., "Development of a Production-Ready, Back-Illuminated CMOS Image Sensor with Small Pixels," IEEE IEDM, Dec. 2007, pp. 1007-10110.

International Search Report and Written Opinion mailed Nov. 9, 2009, for International Application No. PCT/US2009/004903, 8 pages.

* cited by examiner

*Primary Examiner* — Matthew Landau
*Assistant Examiner* — Sun M Kim
(74) *Attorney, Agent, or Firm* — Blakely Sokoloff Taylor & Zafman LLP (57) ABSTRACT

An image sensor having a pixel array comprises periphery elements formed over a substrate, an oxide layer formed over the periphery elements, an epitaxial layer formed in an opening in the oxide layer in a pixel array area, and a plurality of photosensitive elements of the pixel array formed in the epitaxial layer. Formation of an initial metallization layer occurs after the formation of the photosensitive elements in the epitaxial layer. The photosensitive elements can thus be formed in the epitaxial layer at a higher level within an image sensor stack than that of the initial metallization layer. This advantageously allows stack height and pixel size to be reduced, and fill factor to be increased. The image sensor may be implemented in a digital camera or other type of digital imaging device.

15 Claims, 10 Drawing Sheets

IMAGE SENSOR WITH RAISED PHOTOSENSITIVE ELEMENTS

RELATED APPLICATIONS

This application is a divisional application of U.S. patent application Ser. No. 12/208,403, now U.S. Pat. No. 8,211,732, filed Sep. 11, 2008, entitled "Image Sensor with Raised Photosensitive Elements," which is incorporated by reference herein in its entirety.

FIELD OF THE INVENTION

The present invention relates generally to electronic image sensors for use in digital cameras and other types of imaging devices, and more particularly to processing techniques for use in forming image sensors.

BACKGROUND OF THE INVENTION

A typical electronic image sensor comprises a number of light sensitive picture elements ("pixels") arranged in a two-dimensional array. Such an image sensor may be configured to produce a color image by forming an appropriate color filter array (CFA) over the pixels. Examples of image sensors of this type are disclosed in U.S. Patent Application Publication No. 2007/0024931, entitled "Image Sensor with Improved Light Sensitivity," which is incorporated by reference herein.

As is well known, an image sensor may be implemented using complementary metal-oxide-semiconductor (CMOS) circuitry. In such an arrangement, each pixel typically comprises a photodiode and other circuitry elements that are formed in a silicon sensor layer on a silicon substrate. One or more dielectric layers are usually formed above the silicon sensor layer and may incorporate additional circuitry elements as well as multiple levels of metallization used to form interconnects. The side of the image sensor on which the dielectric layers and associated levels of metallization are formed is commonly referred to as the frontside, while the side having the silicon substrate is referred to as the backside.

An image sensor formed in multiple layers as described above may be viewed as an example of an arrangement commonly referred to as a stacked image sensor. Such a stacked image sensor may be formed from a single semiconductor wafer. Other types of stacked image sensors may be formed from separate sensor and circuit wafers that are arranged in a stack and interconnected with one another.

Image sensors may be generally classified as either frontside illuminated or backside illuminated. In a frontside illuminated image sensor, light from a subject scene is incident on the frontside of the image sensor, and the silicon substrate is relatively thick. However, the presence of metallization level interconnects and various other features associated with the dielectric layers on the frontside of the image sensor can adversely impact the fill factor and quantum efficiency of the image sensor.

A backside illuminated image sensor addresses the fill factor and quantum efficiency issues associated with the frontside dielectric layers by thinning or removing the thick silicon substrate and arranging the image sensor such that light from a subject scene is incident on the backside of the image sensor. Thus, the incident light is no longer impacted by metallization level interconnects and other features of the dielectric layers, and fill factor and quantum efficiency are improved.

However, similar improvements in fill factor and quantum efficiency have been difficult to achieve in frontside illuminated image sensors. This is in part due to the height of the image sensor stack, which tends to limit reductions in pixel size as well as improvements in fill factor. Also, when using conventional techniques for forming frontside illuminated image sensors, it can be difficult to precisely control the characteristics of the photodiode depletion regions so as to ensure sufficient charge carriers. Failure to configure the photodiode depletion regions to provide sufficient charge carriers can degrade quantum efficiency and resulting image quality.

Accordingly, a need exists for improved techniques for forming image sensors, which can achieve reduced stack height, smaller pixel sizes and higher fill factor than the conventional techniques without adversely impacting quantum efficiency or image quality.

SUMMARY OF THE INVENTION

In an illustrative embodiment, a frontside illuminated image sensor is formed in a manner which separates the formation of periphery circuitry from the formation of pixel array circuitry, such that the position of the photosensitive elements is raised within an image sensor stack. This advantageously allows stack height and pixel size to be reduced, and fill factor to be increased.

In accordance with one aspect of the invention, a process of forming an image sensor having a pixel array is provided. The process includes the steps of forming periphery elements of the image sensor over a substrate, forming an oxide layer over the periphery elements, forming an opening in the oxide layer in a pixel array area, forming an epitaxial layer in the opening, and forming photosensitive elements of the pixel array in the epitaxial layer. The periphery elements may comprise, for example, polysilicon gates of periphery transistors.

The epitaxial layer may be formed by performing a selective epitaxial growth process such that the epitaxial layer is confined substantially to the pixel array area. The selective epitaxial growth process may be controlled to provide a designated depletion region characteristic for the photosensitive elements.

The process may further include the step of forming an initial metallization layer comprising periphery metal conductors overlying one or more of the periphery elements. The step of forming the initial metallization layer is performed subsequent to the steps of forming the oxide layer, forming the opening in the oxide layer, forming the epitaxial layer in the opening, and forming the photosensitive elements of the pixel array. A plurality of additional metallization layers may be formed subsequent to the formation of the initial periphery metallization layer. Metal conductors of a final metallization layer are used to interconnect the periphery elements or other periphery circuitry with the photosensitive elements or other circuitry of the pixel array.

In accordance with another aspect of the invention, an image sensor having a pixel array comprises periphery elements formed over a substrate, an oxide layer formed over the periphery elements, an epitaxial layer formed in an opening in the oxide layer in a pixel array area, and a plurality of photosensitive elements of the pixel array formed in the epitaxial layer. Formation of metallization layers occurs after the formation of the photosensitive elements in the epitaxial layer. The epitaxial layer may be formed using a selective epitaxial growth process that is controlled to provide a designated depletion region characteristic for the photosensitive elements.

An image sensor in accordance with the invention may be advantageously implemented in a digital camera or other type of imaging device. The illustrative embodiments allow the image sensor photodiodes or other photosensitive elements to be formed at a raised level within the image sensor stack, thereby providing reduced stack height, smaller pixel sizes and higher fill factor. The image sensor in a given such embodiment is also formed in a manner providing improved control of photodiode depletion region characteristics, and thus exhibits improved quantum efficiency and image quality.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

The present invention will be illustrated herein in conjunction with particular embodiments of digital cameras, image sensors, and processing techniques for forming such image sensors. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices and image sensors.

Figure 1:
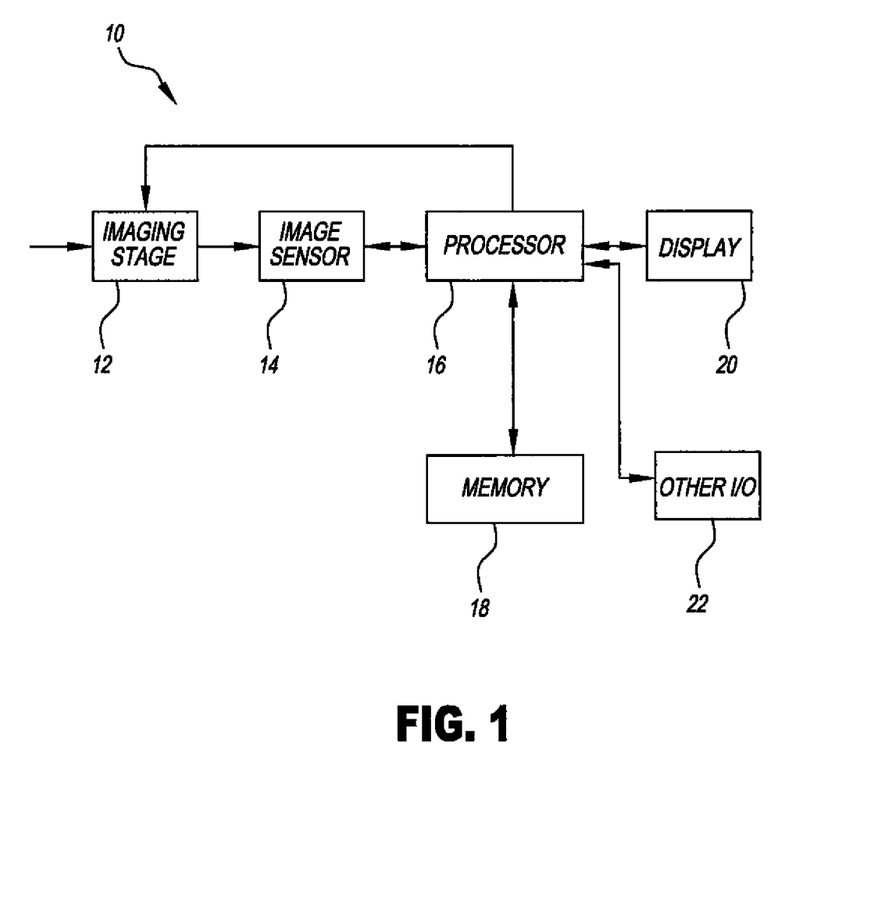
FIG. 1 is a block diagram of a digital camera having a frontside illuminated image sensor configured in accordance with an illustrative embodiment of the invention.

FIG. 1 shows a digital camera 10 in an illustrative embodiment of the invention. In the digital camera, light from a subject scene is input to an imaging stage 12. The imaging stage may comprise conventional elements such as a lens, a neutral density filter, an iris and a shutter. The light is focused by the imaging stage 12 to form an image on an image sensor 14, which converts the incident light to electrical signals. The digital camera 10 further includes a processor 16, a memory 18, a display 20, and one or more additional input/output (I/O) elements 22.

Although shown as separate elements in the embodiment of FIG. 1, the imaging stage 12 may be integrated with the image sensor 14, and possibly one or more additional elements of the digital camera 10, to form a compact camera module.

The image sensor 14 is assumed in the present embodiment to be a CMOS image sensor, although other types of image sensors may be used in implementing the invention. More particularly, the image sensor 14 comprises a stacked image sensor that is formed in a manner to be described below in conjunction with FIGS. 2 through 9. The image sensor generally comprises a pixel array having a plurality of pixels arranged in rows and columns and may include additional circuitry associated with sampling and readout of the pixel array, such as signal generation circuitry, signal processing circuitry, row and column selection circuitry, etc. This sampling and readout circuitry may comprise, for example, an analog signal processor for processing analog signals read out from the pixel array and an analog-to-digital converter for converting such signals to a digital form. These and other types of circuitry suitable for use in the digital camera 10 are well known to those skilled in the art and will therefore not be described in detail herein. Portions of the sampling and readout circuitry may be arranged external to the image sensor, or formed integrally with the pixel array, for example, on a common integrated circuit with photodiodes and other elements of the pixel array.

The image sensor 14 will typically be implemented as a color image sensor having an associated CFA pattern. Examples of CFA patterns that may be used with the image sensor 14 include those described in the above-cited U.S. Patent Application Publication No. 2007/0024931, although other CFA patterns may be used in other embodiments of the invention. As another example, a conventional Bayer pattern may be used, as disclosed in U.S. Pat. No. 3,971,065, entitled "Color Imaging Array," which is incorporated by reference herein.

The processor 16 may comprise, for example, a microprocessor, a central processing unit (CPU), an application-specific integrated circuit (ASIC), a digital signal processor (DSP), or other processing device, or combinations of multiple such devices. Various elements of the imaging stage 12 and the image sensor 14 may be controlled by timing signals or other signals supplied from the processor 16.

The memory 18 may comprise any type of memory, such as, for example, random access memory (RAM), read-only memory (ROM), Flash memory, disk-based memory, removable memory, or other types of storage elements, in any combination.

Functionality associated with sampling and readout of the pixel array and the processing of corresponding image data may be implemented at least in part in the form of software that is stored in memory 18 and executed by processor 16.

A given image captured by the image sensor 14 may be stored by the processor 16 in memory 18 and presented on display 20. The display 20 is typically an active matrix color liquid crystal display (LCD), although other types of displays may be used. The additional I/O elements 22 may comprise, for example, various on-screen controls, buttons or other user interfaces, network interfaces, memory card interfaces, etc.

Additional details regarding the operation of a digital camera of the type shown in FIG. 1 can be found, for example, in the above-cited U.S. Patent Application Publication No. 2007/0024931.

It is to be appreciated that the digital camera as shown in FIG. 1 may comprise additional or alternative elements of a type known to those skilled in the art. Elements not specifically shown or described herein may be selected from those known in the art. As noted previously, the present invention may be implemented in a wide variety of other types of digital cameras or imaging devices. Also, as mentioned above, certain aspects of the embodiments described herein may be implemented at least in part in the form of software executed by one or more processing elements of an imaging device. Such software can be implemented in a straightforward manner given the teachings provided herein, as will be appreciated by those skilled in the art.

The image sensor 14 may be fabricated on a silicon substrate or other type of substrate. In a typical CMOS image sensor, each pixel of the pixel array includes a photodiode and associated circuitry for measuring the light level at that pixel.

Such circuitry may comprise, for example, transfer gates, reset transistors, select transistors, output transistors, and other elements, configured in a well-known conventional manner.

The image sensor 14 in the embodiments described herein is a stacked image sensor configured for frontside illumination. It may also be viewed as an example of a type of arrangement also referred to as a sensor on top (SOT) arrangement. Other embodiments may use other image sensor configurations. The term "stacked image sensor" as used herein is therefore intended to be construed broadly so as to encompass, by way of example, any image sensor comprising a sensor layer and a circuit layer arranged in a stack, as well as other types of image sensors comprising stacks of multiple layers.

As indicated above, FIGS. 2 through 9 illustrate the process of forming the stacked image sensor 14 in one embodiment of the present invention. It should be noted that these figures are simplified in order to clearly illustrate various aspects of the present invention, and are not necessarily drawn to scale. A given embodiment may include a variety of other features or elements that are not explicitly illustrated but would be familiar to one skilled in the art as being commonly associated with image sensors of the general type described.

Figure 2:
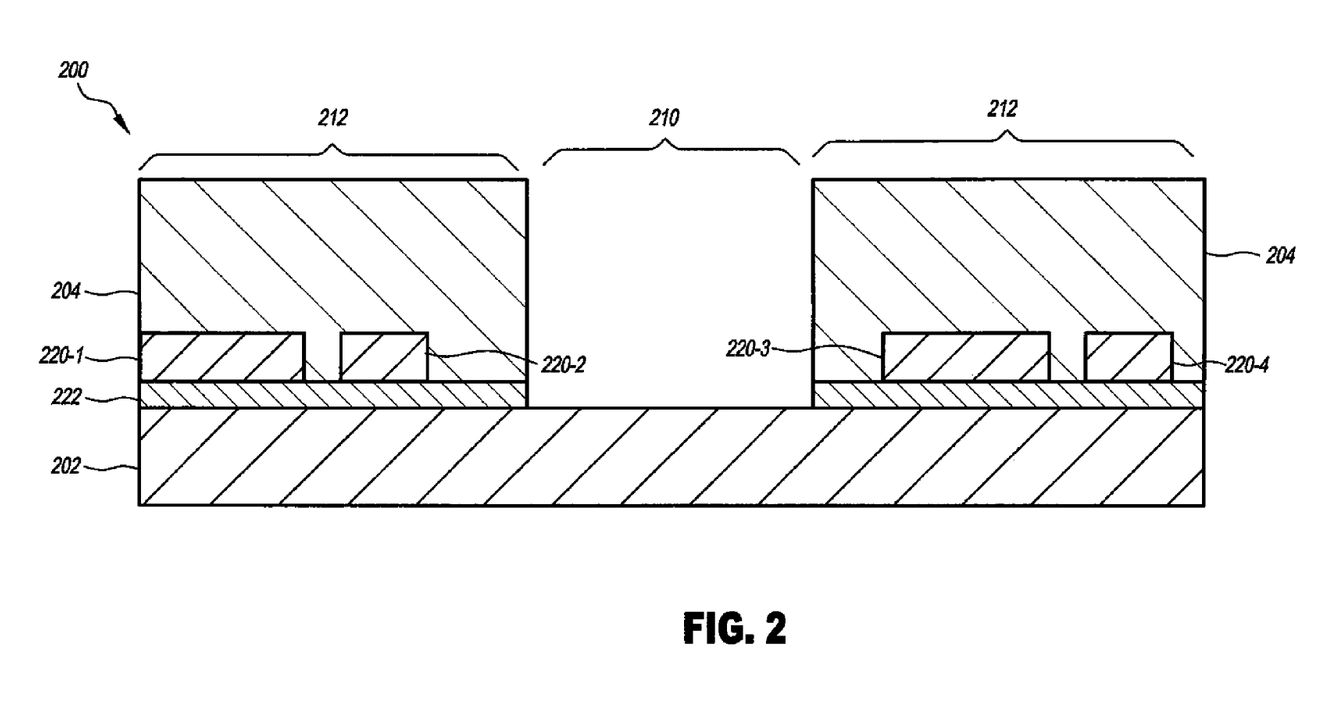
FIGS. 2 through 9 are cross-sectional views showing portions of a frontside illuminated image sensor at various steps in an exemplary process for forming such an image sensor, in accordance with an illustrative embodiment of the invention.

FIG. 2 shows a portion of an image sensor wafer 200 utilized in forming the stacked image sensor 14. At this stage in the process, the image sensor wafer 200 comprises a silicon substrate 202 and an oxide layer 204. The oxide layer 204 serves as an isolation layer in the present embodiment, and the term "oxide layer" is intended to be construed broadly so as to encompass a wide variety of such layers. As will be described, the image sensor wafer 200 is further processed to form a plurality of stacked image sensors each having a pixel array. The portion of the image sensor wafer 200 as shown in FIG. 2 generally corresponds to a particular one of the image sensors, and includes a pixel array area 210 surrounded by periphery areas 212. The pixel array area 210 is the area in which the photodiodes or other photosensitive elements of the image sensor will eventually be formed. It will be assumed for purposes of the illustrative embodiments that the photosensitive elements comprise photodiodes. Periphery circuitry comprising periphery elements such as gates, vias, contacts, conductors, and bond pads, are eventually formed in the periphery areas 212.

It should be noted that terms such as "on" or "over" when used in conjunction with layers of an image sensor wafer or corresponding image sensor are intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

The image sensor wafer 200 may comprise, for example, a silicon-on-insulator (SOI) wafer, an epitaxial wafer or a bulk semiconductor wafer. It is to be appreciated that the present invention is not limited in terms of the number or type of wafers that are utilized to form the sensor and circuit layers of a given stacked image sensor.

In this embodiment, periphery elements of the image sensor are formed over the substrate 202. The periphery elements illustratively comprise polysilicon gates 220 of periphery transistors, formed in the periphery areas 212 of the image sensor wafer 200. Four such polysilicon gates are shown, denoted 220-1, 220-2, 220-3 and 220-4. As indicated previously, such periphery elements are part of the periphery circuitry of the image sensor. The particular number and type of periphery elements shown is presented by way of example only, and numerous other configurations of such elements may be used. The polysilicon gates 220 in this embodiment are formed over a gate oxide layer 222 that is deposited on the substrate 202. Source and drain regions of the periphery transistors may be formed in the substrate 202 using conventional implant techniques, although such regions are not shown in the figure.

Formation of the above-noted periphery circuitry is then temporarily stopped, just prior to an initial periphery contact formation process, also referred to herein as a Contact 0 process, and the oxide layer 204 is deposited. As deposited, the oxide layer covers the periphery areas 212 as well as the pixel array area 210. An opening is then formed in the oxide layer 204 in the pixel array area 210. This opening may be formed, for example, using conventional lithography operations such as photoresist deposition followed by exposing, developing, etching and stripping. The resulting image sensor wafer structure is as shown in FIG. 2.

Thus, in the present embodiment, the formation of the periphery circuitry is halted prior to implementation of any periphery metal processes, and the oxide layer 204 is deposited and etched to form the opening in the pixel array area 210.

The thickness of the oxide layer 204 will vary depending upon the particular metal processes that are to be used in forming the image sensor. However, in a typical implementation, this oxide layer could have a thickness on the order of several micrometers ($\mu$m). A more particular exemplary value for the thickness of oxide layer 204 is approximately 1.5 $\mu$m.

An epitaxial layer 300 is then formed in the opening etched in the oxide layer 204, as will now be described in conjunction with FIG. 3. The epitaxial layer 300 is preferably formed utilizing a selective epitaxial growth process such that the epitaxial layer is confined substantially to the pixel array area 210. Epitaxial growth over single crystalline silicon will result in single crystalline silicon having the same orientation as the underlying single crystalline silicon. The selective epitaxial growth process will thus grow crystalline silicon in the same orientation as that of the underlying substrate 202.

The selective epitaxial growth process may be controlled to provide a designated depletion region characteristic for the photodiodes that are to be formed in the pixel array area 210. For example, various characteristics such as the size, shape and depth of the photodiode depletion regions can be readily controlled.

As will be described below, forming the photodiodes in the epitaxial region 300 allows the photodiodes to be raised or "lifted" to a higher level within the image sensor stack than would otherwise be possible using conventional techniques for forming stacked image sensors. This advantageously allows stack height and pixel size to be reduced, and fill factor to be increased, without adversely impacting quantum efficiency or other aspects of image sensor performance.

Figure 3:
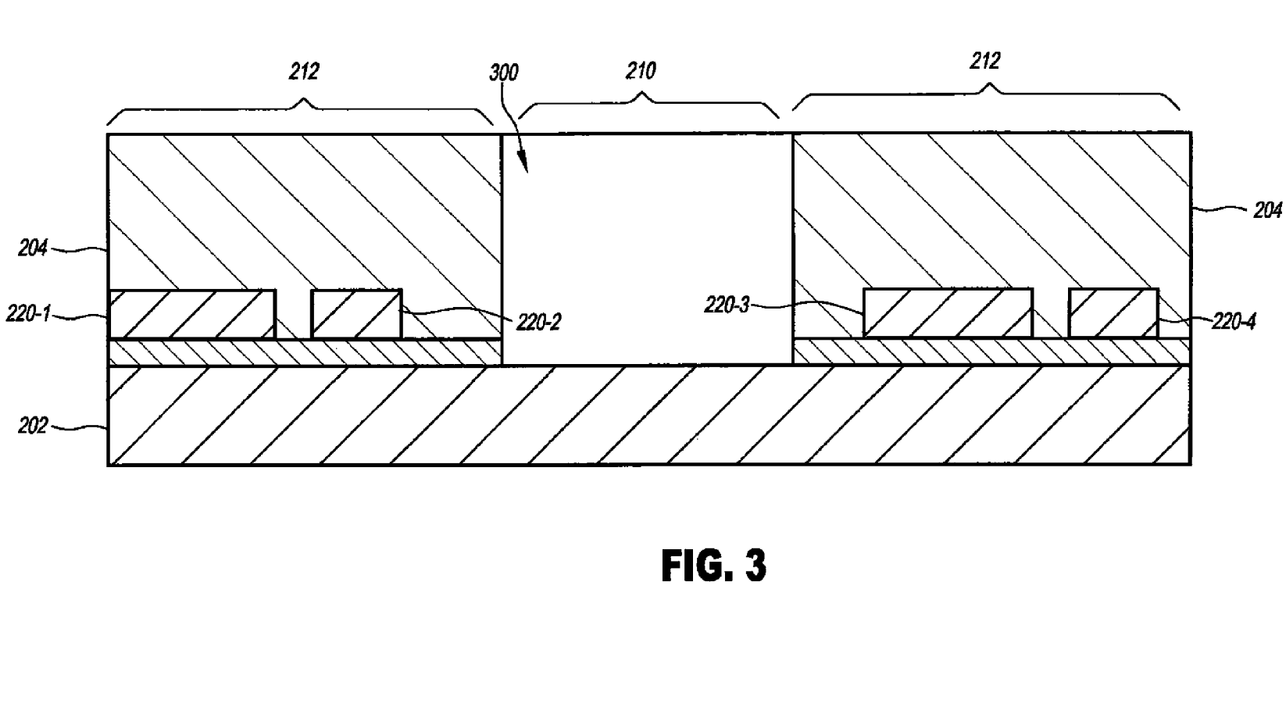

After formation of the epitaxial layer 300, a chemical-mechanical polishing (CMP) operation may be applied to produce the image sensor wafer structure as shown in FIG. 3.

Figure 4:
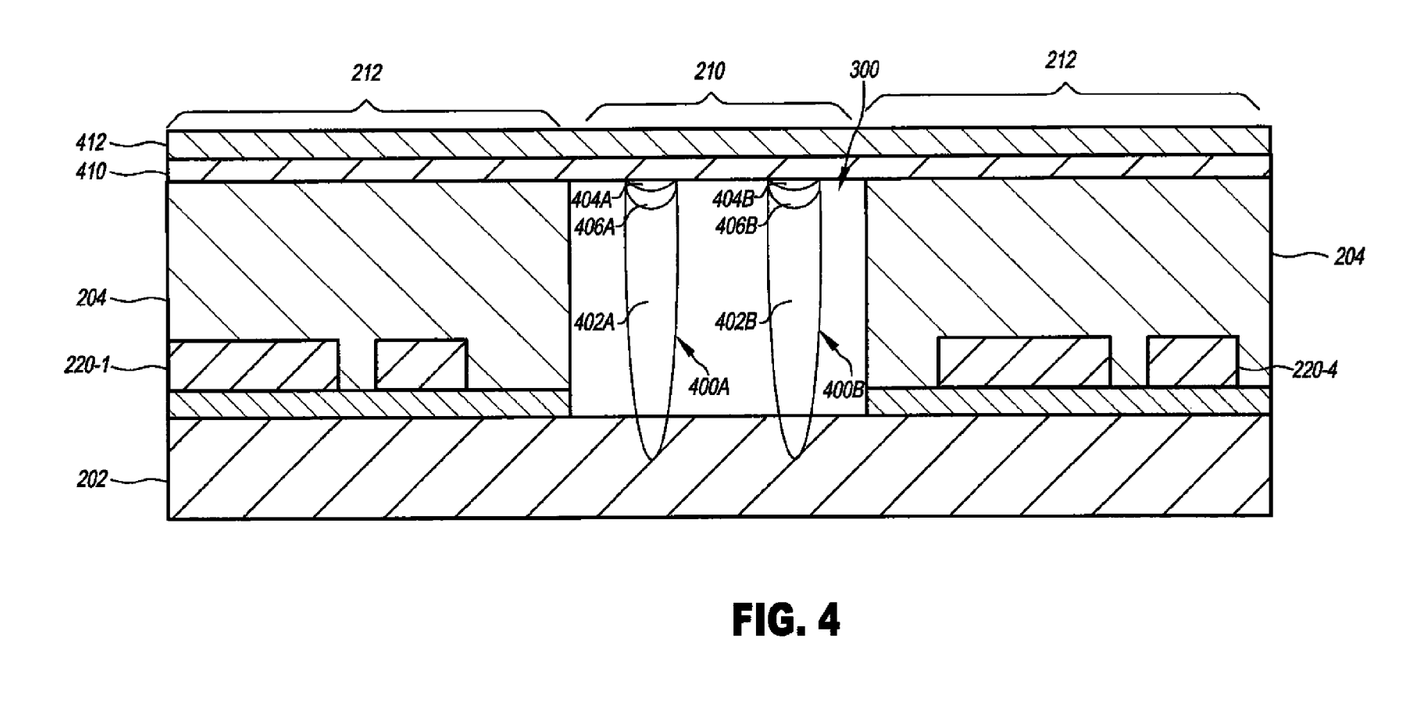

The photodiodes of the pixel array are then formed in the epitaxial layer 300, as is illustrated in FIG. 4. Two such photodiodes 400A and 400B are shown in the figure for simplicity and clarity of illustration, although a given pixel array will of course typically include many more photodiodes. The photodiodes are formed in respective well regions 402A and 402B. Each photodiode includes a first semiconductor region 404A or 404B of a first conductivity type and a second semiconductor region 406A or 406B of a second conductivity type. Although the well regions are shown as extending into the substrate 202, this is by way of example and in other embodiments the well regions could be confined to the epitaxial layer 300.

The well regions 402A and 402B may be n-wells or p-wells. As mentioned previously, in a typical CMOS image sensor, each pixel typically comprises a photodiode and a number of transistors. The pixel transistors may be p-type MOS (PMOS) transistors, in which case the photodiode and the transistors are generally formed in n-well regions in a p-type semiconductor layer. Alternatively, the pixel transistors may be n-type MOS (NMOS) transistors, in which case the photodiode and the transistors are generally formed in p-well regions in an n-type semiconductor layer.

As a more particular example, the first semiconductor regions 404A and 404B may comprise N+ regions, and the second semiconductor regions 406A and 406B may comprise P regions. In this case, the well regions 402A and 402B will be n-well regions. Alternatively, the first semiconductor regions 404A and 404B may comprise P+ regions, and the second semiconductor regions 406A and 406B may comprise N regions. In this case, the well regions 402A and 402B will be p-well regions.

The various doped regions associated with the photodiodes 400A and 400B may be formed using implant operations of a type familiar to those skilled in the art.

Elements of other pixel array circuitry may also be formed at this time, including elements of associated transistors such as, for example, transfer gates, reset transistors, select transistors, source follower output transistors, etc. Such elements are omitted from the figure for simplicity and clarity of illustration, but could be formed in a conventional manner.

As indicated above, the photodiodes 400A and 400B are raised or lifted so as to occupy a relatively high level within the image sensor stack compared to conventional arrangements. More particularly, these photodiodes are formed at a level within the image sensor stack that is higher than a first metallization level, also referred to as an M1 level. This raising or lifting of the photodiodes within the image sensor stack is also apparent from FIG. 9, which illustrates a substantially complete image sensor.

After formation of the photodiodes and associated circuitry elements of the pixel array in the pixel array area 210, a gate oxide layer 410 is deposited, followed by deposition of a polysilicon layer 412.

Figure 5:
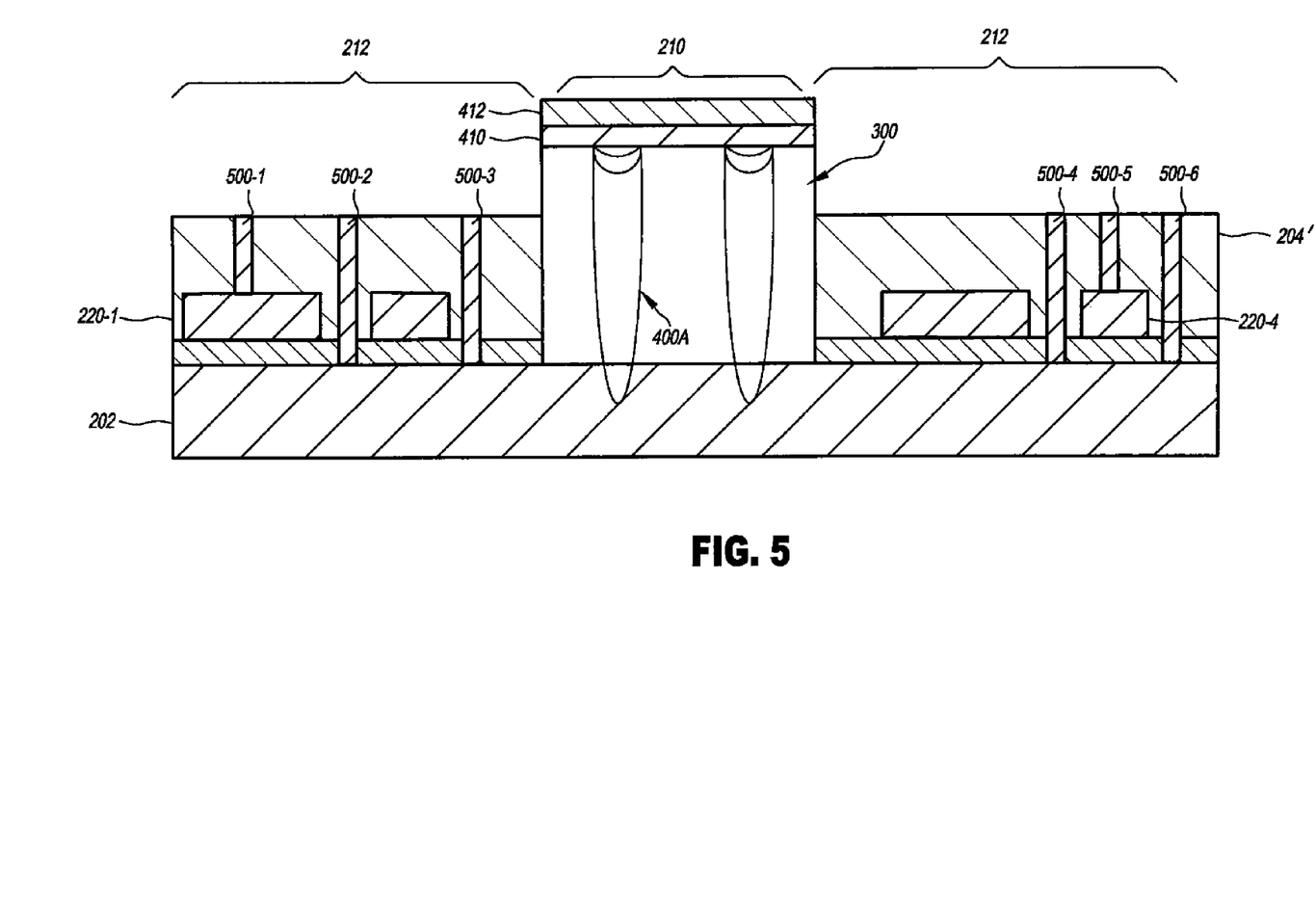

Referring now to FIG. 5, the image sensor wafer structure is shown after annealing of the polysilicon layer 412, followed by selective etching of the layers 412, 410 and 204 in the periphery areas 212. This results in an etched oxide layer 204' that is substantially less thick than the corresponding layer 204 shown in FIGS. 2, 3 and 4. For example, the oxide layer 204' may be about 0.6 µm thick, as compared to about 1.5 µm for the original oxide layer 204. The etched oxide layer 204' is an example of what is also referred to herein as an interlayer dielectric (ILD) layer.

Metal processes are then performed to form multiple metal layers and other metal features in the periphery areas 212. The metal processes in this embodiment comprise metal processes denoted as Contact 0, M1, Via 1, M2, Via 2, M3, Via 3 and M4, although other types of metal processes may be used in other embodiments. Certain of these metal processes are also used to form metal features in the pixel array area 210, as will be described.

Before performing the initial metal processes, a nitride layer may be formed over the pixel array area 210. The nitride layer, which is not shown in the figures, may be used to provide a hard mask to permit dry etching of the oxide layer 204 in the periphery areas 212. The nitride layer may be removed, for example, after the M1 and M2 layers and their associated periphery contacts and vias are formed, but prior to formation of the M3 and M4 layers. The metallization layers M1, M2, M3 and M4 are also referred to herein as metallization levels.

FIG. 5 shows periphery Contact 0 metal conductors 500-1 through 500-6 that may illustratively be formed of tungsten. These conductors make contact with the polysilicon gates 220 or associated circuit elements such as periphery transistor source and drain regions formed in the substrate 202. The thickness of the conductors will typically vary depending upon the image sensor design, but may be on the order of about 0.3 to 2.0 µm. The shape of a given conductor 500 in a plane perpendicular to the cross-section shown in the figure is typically square, and may be, for example, about 0.1 to 0.3 µm square. A variety of other materials may be used to form conductors 500 and other conductors referred to herein. The circuit elements formed in the substrate 202 in this embodiment are examples of circuit layer circuit elements, although such elements are not shown in the figure. Thus, the circuit layer in this stacked image sensor may be viewed as comprising the substrate 202.

Figure 6:
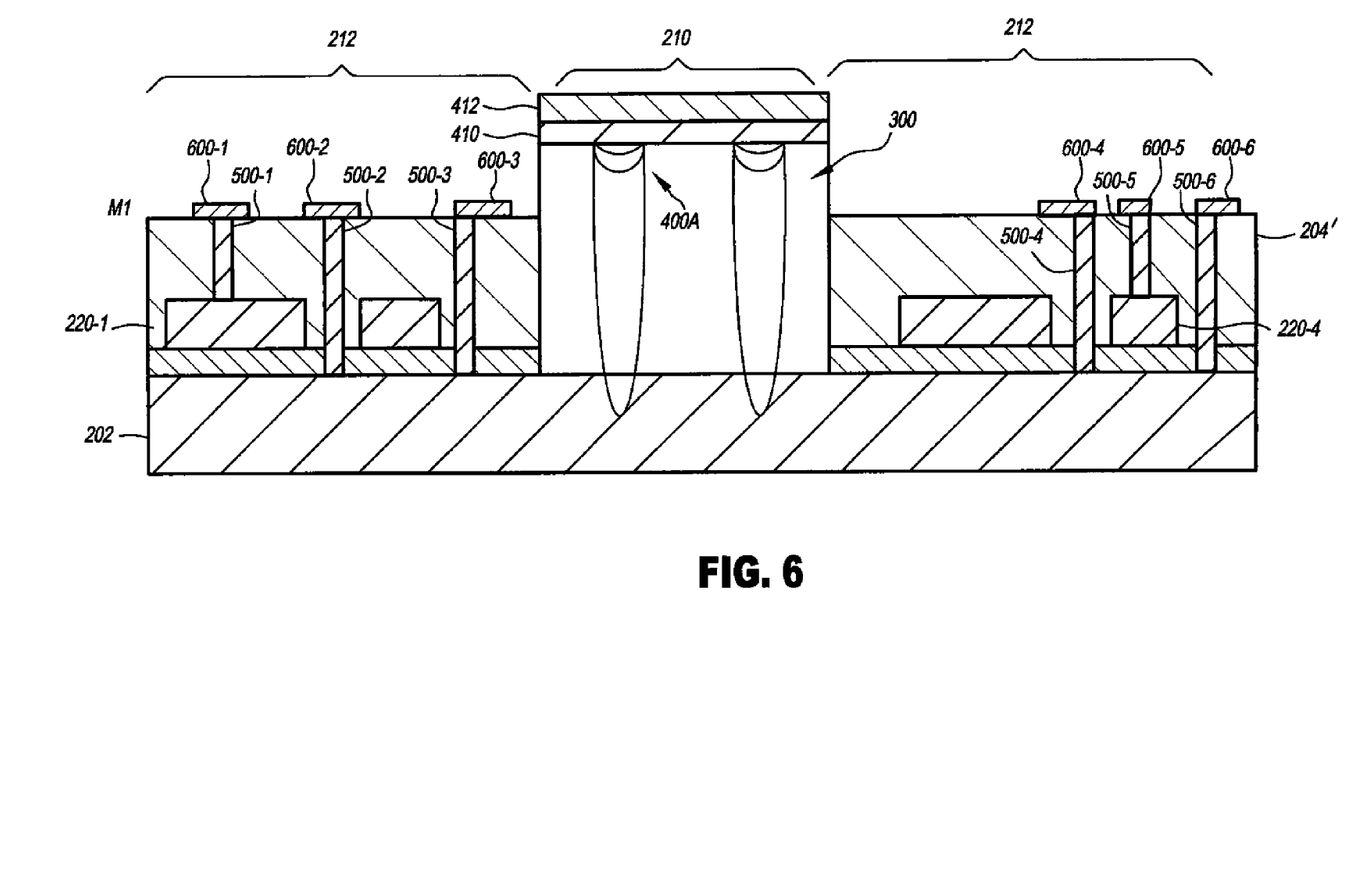

FIG. 6 shows first metallization layer or M1 conductors 600-1 through 600-6 which are coupled to respective ones of the Contact 0 conductors 500-1 through 500-6.

The metallization layer M1 in this embodiment is an initial periphery metallization layer comprising periphery metal conductors 600 overlying one or more of the periphery elements 220. As noted above, this metallization layer is formed subsequent to the steps of forming the oxide layer 204, forming the opening in the oxide layer in the pixel array area 210, forming the epitaxial layer 300 in the opening, and forming the photodiodes 400A and 400B of the pixel array in the epitaxial layer. The layers M2 and M3 comprise additional periphery metallization layers formed after the formation of the initial periphery metallization layer M1. At least the M3 layer may also comprise conductors formed in the pixel array area, as will be described in conjunction with FIG. 8.

Figure 7:
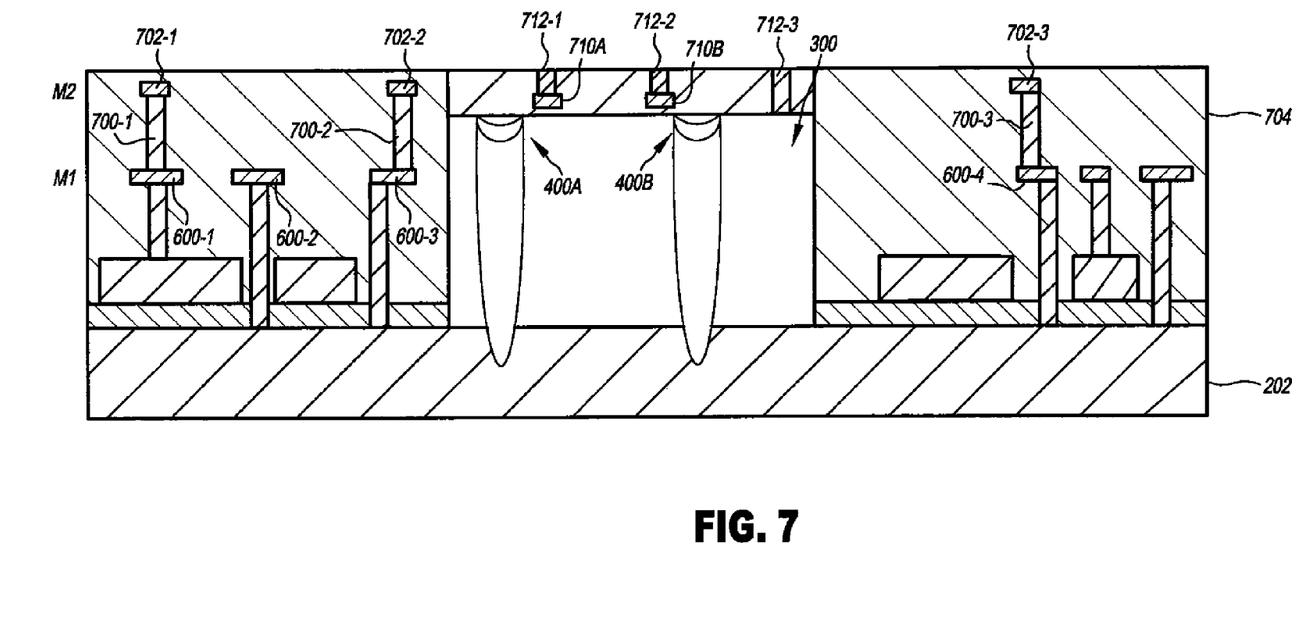

Referring now to FIG. 7, formation of Via 1 conductors and second metallization layer or M2 conductors is shown. Via 1 conductors 700-1 through 700-3 are coupled to respective M2 conductors 702-1 through 702-3. An ILD layer 704 at this stage comprises the etched oxide layer 204' of FIG. 6 plus additional deposited oxide layers associated with the respective metallization layers and vias. Also shown in the figure are transfer gates 710A and 710B associated with the respective photodiodes 400A and 400B. These transfer gates are formed from portions of the polysilicon layer 412 using conventional techniques.

A number of pixel array conductors 712-1, 712-2 and 712-3 are also shown in FIG. 7. These conductors are also referred to as photodiode Contact 0 conductors. Conductors 712-1 and 712-2 are coupled to respective ones of the transfer gates 710A and 710B. The third pixel array conductor 712-3 is associated with a reset transistor, elements of which are formed in the epitaxial layer 300 but not shown in the figure.

Figure 8:
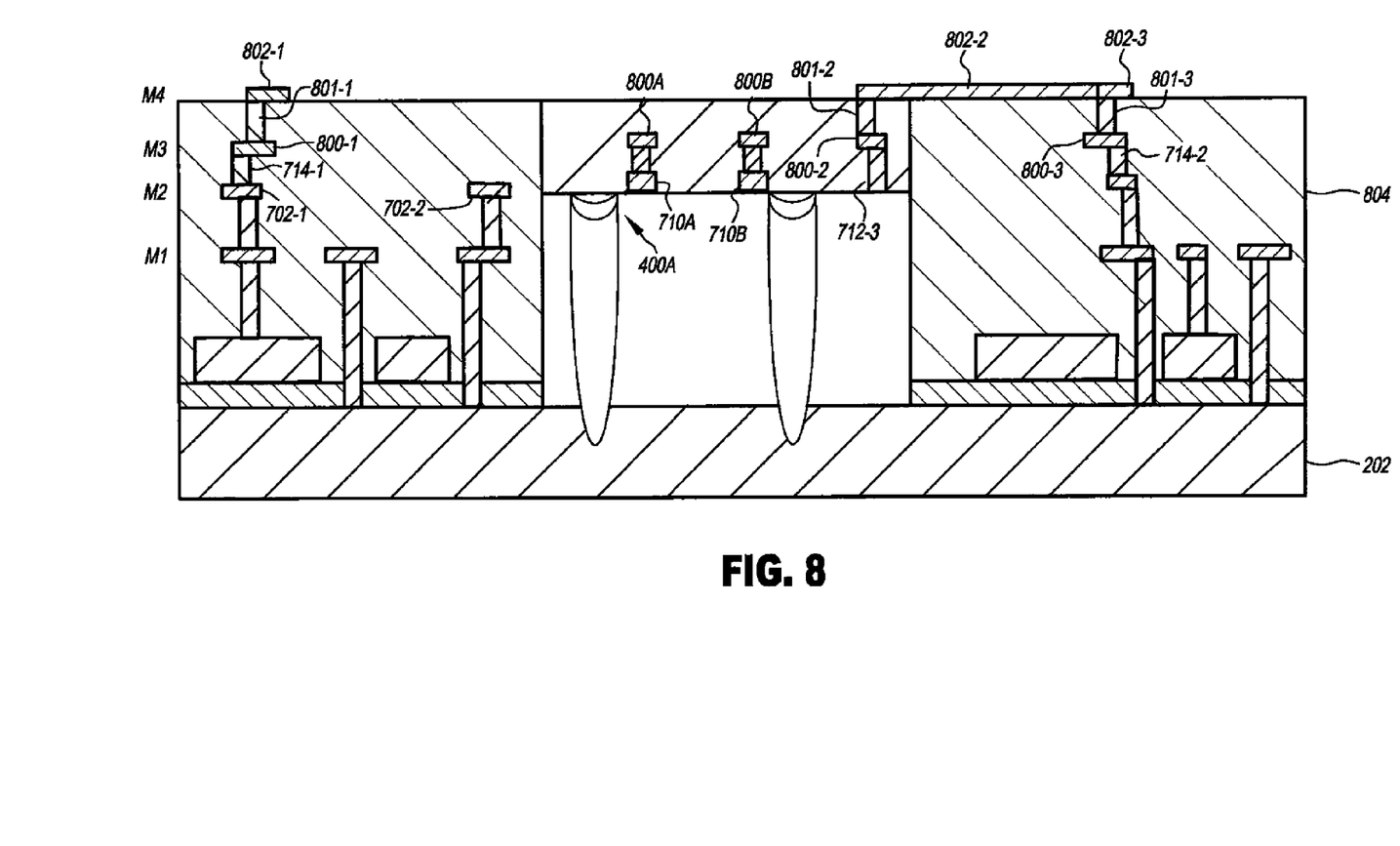

FIG. 8 shows Via 2 conductors 714-1 and 714-2, as well as third metallization layer or M3 conductors 800-1 through 800-3, Via 3 conductors 801-1, 801-2 and 801-3, and fourth metallization layer or M4 conductors 802-1, 802-2 and 802-3. Additional M3 conductors in the pixel array area include transfer gate conductors 800A and 800B coupled to respective transfer gates 710A and 710B. The thicknesses of the various metallization and via conductors will generally vary depending upon the design, but a given such conductor may be, for example, approximately 0.4 µm thick in the cross-section of the figure. As previously indicated, the figures are not necessarily drawn to scale.

An ILD layer 804 at this stage comprises the ILD layer 704 of FIG. 7 plus additional deposited oxide layers associated with the respective additional metallization layers M3 and M4 and corresponding vias. A conventional passivation operation may be applied after formation of the final metallization layer M4.

It can be seen in FIG. 8 that a connection is made in the M4 layer between an element of the pixel array circuitry and an element of the periphery circuitry. Thus, the M4 layer serves to provide interconnection between the pixel array circuitry and the periphery circuitry. More particularly, in this embodiment the M4 conductor 802-2 couples the pixel array conductors 712-3, 800-2 and 801-2 associated with the reset gate to the periphery conductors 802-3, 801-3, 800-3 and 714-2. In other embodiments, such connections between the pixel array circuitry and the periphery circuitry may be made in other metal layers, such as both M3 and M4 layers.

Figure 9:
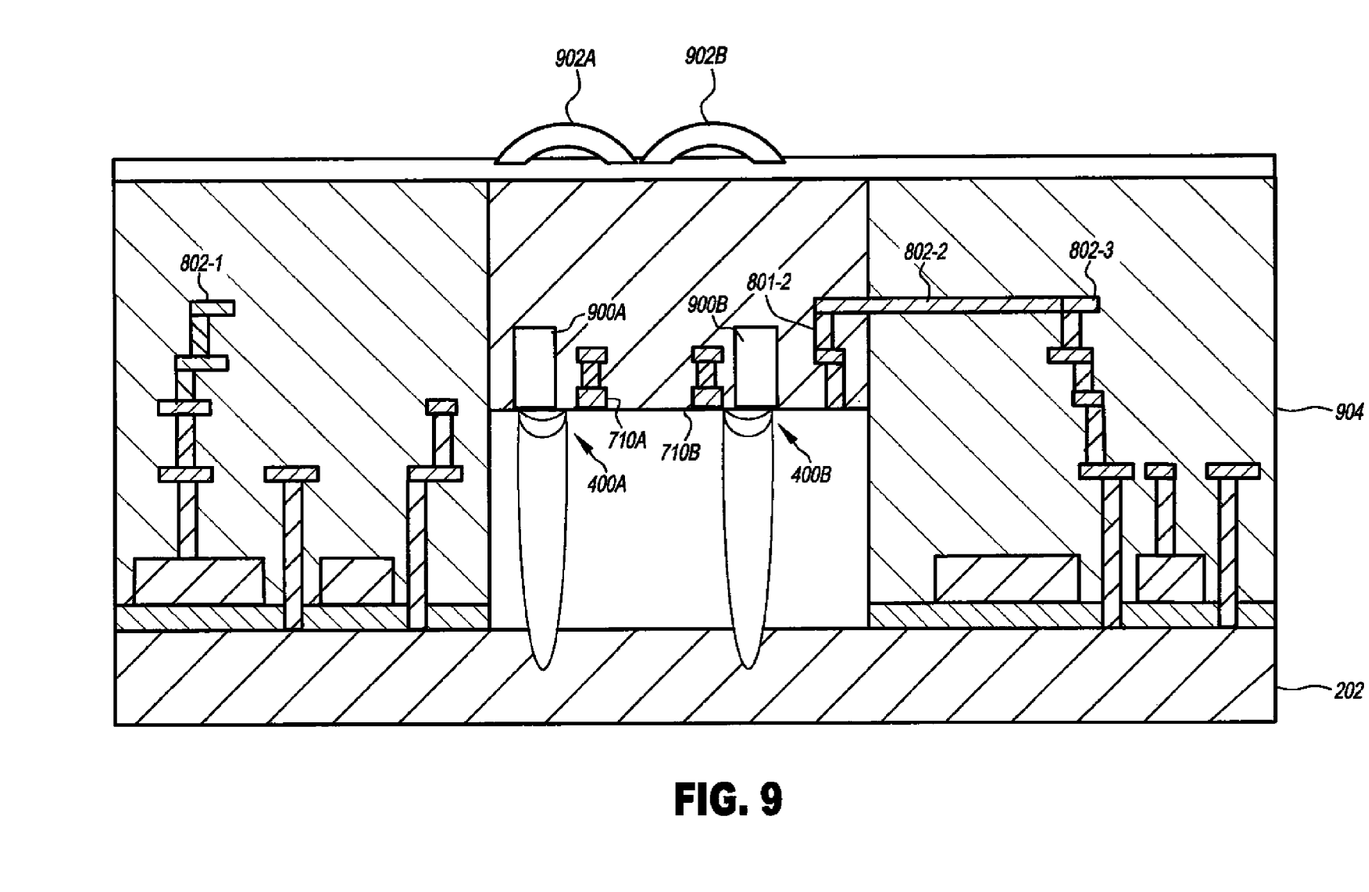

FIG. 9 shows the image sensor wafer structure after completion of a number of additional processing operations. These additional processing operations include the formation of CFA elements 900A and 900B and associated microlenses 902A and 902B over the respective photodiodes 400A and 400B of the pixel array. These and other aspects of image sensor formation may be implemented using conventional techniques that are familiar to those skilled in the art. An ILD layer 904 at this stage comprises the ILD layer 804 of FIG. 8 plus one or more additional deposited oxide layers.

It can be seen that the photodiodes 400A and 400B as shown in FIG. 9, as a result of being formed in the epitaxial layer 300, are raised or lifted so as to occupy a relatively high level within the image sensor stack compared to conventional arrangements. For example, in one conventional arrangement described above, all metallization layers and dielectric layers are formed above a sensor layer in which the photodiodes are formed. In the illustrative embodiment of FIG. 9, the position of the photodiodes 400A and 400B is raised within the ILD layer 904 relative to an arrangement in which an entire such ILD layer and corresponding metallization layers and vias are formed above a sensor layer containing the photodiodes.

Figure 10:
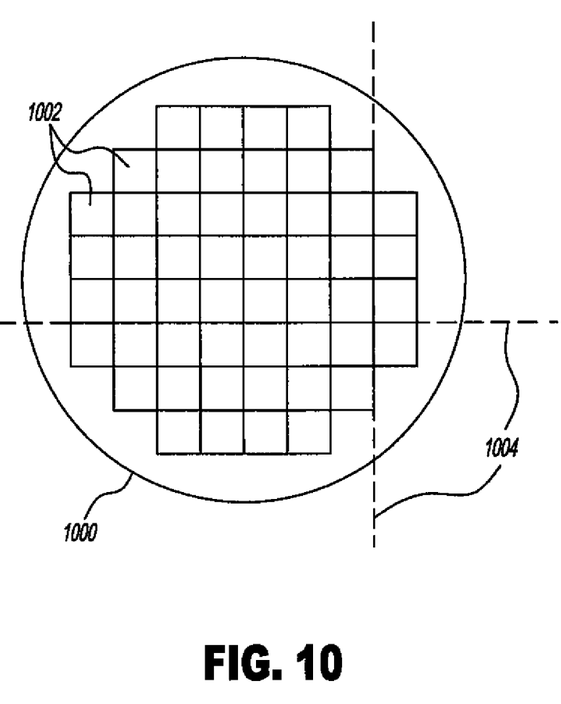
FIG. 10 is a plan view of an image sensor wafer comprising multiple image sensors formed using the exemplary process of FIGS. 2 through 9.

As indicated above, the processing operations illustrated in FIGS. 2 through 9 are wafer level processing operations applied to an image sensor wafer. FIG. 10 shows a plan view of an image sensor wafer 1000 comprising a plurality of image sensors 1002. The image sensors 1002 are formed through wafer level processing of the image sensor wafer 1000 as described in conjunction with FIGS. 2 through 9. The image sensors are then separated from one another by dicing the wafer along dicing lines 1004. A given one of the image sensors 1002 corresponds to image sensor 14 in digital camera 10 of FIG. 1.

The above-described illustrative embodiments advantageously provide an improved processing arrangement for forming a frontside illuminated stacked image sensor. A particular advantage of this approach is that stack height can be significantly reduced through the formation of raised photodiodes in the epitaxial layer. This reduction in stack height allows pixel sizes of less than about 1.0 μm² to be achieved, and allows improvement in the fill factor of the sensor, without adversely impacting quantum efficiency or image quality. Moreover, the process as described can simplify the manufacturing of the image sensor, and reduce image sensor cost. For example, improvements in fill factor and quantum efficiency comparable to those associated with backside illuminated image sensors can be achieved, but with fewer process steps and using only a single semiconductor wafer.

The invention has been described in detail with particular reference to certain illustrative embodiments thereof, but it will be understood that variations and modifications can be effected within the scope of the invention as set forth in the appended claims. For example, the invention can be implemented in other types of image sensors and digital imaging devices, using alternative materials, wafers, layers, process steps, etc. Also, various process parameters such as layer thicknesses and material types described in conjunction with the illustrative embodiments can be varied in alternative embodiments. These and other alternative embodiments will be readily apparent to those skilled in the art.

PARTS LIST

10 digital camera
12 imaging stage
14 image sensor
16 processor
18 memory
20 display
22 input/output (I/O) elements
200 image sensor wafer
202 substrate
204 oxide layer
210 pixel array area
212 periphery area
220 polysilicon gate
222 gate oxide layer
300 epitaxial layer
400 photodiode
402 well region
404 first semiconductor region
406 second semiconductor region
410 gate oxide layer
412 polysilicon layer
500 periphery Contact 0 conductor
600 M1 conductor
700 Via 1 conductor
702 M2 conductor
704 inter-layer dielectric
710 transfer gate
712 pixel array Contact 0 conductor
714 Via 2 conductor
800 M3 conductor
801 Via 3 conductor
802 M4 conductor
804 inter-layer dielectric
900 color filter array element
902 microlens
904 inter-layer dielectric
1000 image sensor wafer
1002 image sensors
1004 dicing lines

The invention claimed is:

1. An image sensor having a pixel array, the image sensor comprising:
   a plurality of periphery elements formed over a substrate;
   an oxide layer formed over the periphery elements, the oxide layer including a pixel array area having an opening;
   an epitaxial layer formed in the opening of the oxide layer, the epitaxial layer including at least one well extending through a thickness of the epitaxial layer into the substrate, wherein the epitaxial layer includes at least one of a transfer gate, a reset transistor, a select transistor, and a source follower output transistor; and a plurality of photosensitive elements of the pixel array area formed within the at least one well in the epitaxial layer.

2. The image sensor of claim 1 wherein the periphery elements comprise polysilicon gates of periphery transistors.

3. The image sensor of claim 1 further comprising an initial metallization layer comprising periphery metal conductors overlying one or more of the periphery elements.

4. The image sensor of claim 3 wherein the photosensitive elements are formed in the epitaxial layer at a higher level within an image sensor stack than that of the initial metallization layer.

5. The image sensor of claim 3 further comprising a plurality of additional metallization layers formed over the initial metallization layer.

6. The image sensor of claim 1 further comprising metal conductors interconnecting pixel array circuitry with periphery circuitry, wherein the metal conductors comprise final metallization layer conductors.

7. The image sensor of claim 1 wherein the image sensor comprises a CMOS image sensor.

8. A digital imaging device comprising:
an image sensor having a pixel array; and
one or more processing elements configured to process outputs of the image sensor to generate a digital image, wherein the image sensor comprises:
  a plurality of periphery elements formed over a substrate,
  an oxide layer formed over the periphery elements, the oxide layer including a pixel array area having an opening,
  an epitaxial layer formed in the opening of the oxide layer, the epitaxial layer including at least one well extending through a thickness of the epitaxial layer into the substrate, wherein the epitaxial layer includes at least one of a transfer gate, a reset transistor, a select transistor, and a source follower output transistor, and
  a plurality of photosensitive elements of the pixel array area formed within the at least one well in the epitaxial layer.

9. The digital imaging device of claim 8 wherein the imaging device comprises a digital camera.

10. The digital imaging device of claim 8 wherein the periphery elements comprise polysilicon gates of periphery transistors.

11. The digital imaging device of claim 8 wherein the image sensor further comprises an initial metallization layer comprising periphery metal conductors overlying one or more of the periphery elements.

12. The digital imaging device of claim 11 wherein the photosensitive elements are formed in the epitaxial layer at a higher level within an image sensor stack than that of the initial metallization layer.

13. The digital imaging device of claim 11 further comprising a plurality of additional metallization layers formed over the initial metallization layer.

14. The digital imaging device of claim 1 further comprising metal conductors interconnecting pixel array circuitry with periphery circuitry, wherein the metal conductors comprise final metallization layer conductors.

15. The digital imaging device of claim 1 wherein the image sensor comprises a CMOS image sensor.

* * * * *